US008287686B2

(12) United States Patent
Dershem

(10) Patent No.: US 8,287,686 B2
(45) Date of Patent: Oct. 16, 2012

(54) DERIVATIVES OF POLY(STYRENE-CO-ALLYL ALCOHOL) AND METHODS FOR USE THEREOF

(75) Inventor: Stephen M. Dershem, San Diego, CA (US)

(73) Assignee: Designer Molecules, Inc., San Diego, CA (US)

( * ) Notice: Subject to any disclaimer, the term of this patent is extended or adjusted under 35 U.S.C. 154(b) by 847 days.

(21) Appl. No.: 11/880,944

(22) Filed: Jul. 24, 2007

(65) Prior Publication Data
US 2008/0017308 A1 Jan. 24, 2008

Related U.S. Application Data

(60) Provisional application No. 60/833,137, filed on Jul. 24, 2006, provisional application No. 60/922,408, filed on Apr. 9, 2007.

(51) Int. Cl.
| | |
|---|---|
| C09J 5/02 | (2006.01) |
| C04B 37/00 | (2006.01) |
| C08F 222/40 | (2006.01) |
| C08F 118/02 | (2006.01) |
| C08L 37/00 | (2006.01) |
| C08L 39/00 | (2006.01) |

(52) U.S. Cl. ............... 156/325; 156/307.3; 524/548; 526/319

(58) Field of Classification Search ............ 156/307.3, 156/325; 524/548; 526/319
See application file for complete search history.

(56) References Cited

U.S. PATENT DOCUMENTS

| | | | |
|---|---|---|---|
| 3,905,820 | A | 9/1975 | Frass |
| 4,111,879 | A | 9/1978 | Mori et al. |
| 4,540,829 | A | 9/1985 | Hefner |
| 4,944,989 | A | 7/1990 | Dorsch |
| 4,968,738 | A | 11/1990 | Dershem |
| 5,045,127 | A | 9/1991 | Dershem et al. |
| 5,064,480 | A | 11/1991 | Dershem et al. |
| 5,155,177 | A | 10/1992 | Frihart |
| 5,232,962 | A | 8/1993 | Dershem et al. |
| 5,266,610 | A | 11/1993 | Malhotra et al. |
| 5,306,333 | A | 4/1994 | Dershem et al. |
| 5,358,992 | A | 10/1994 | Dershem et al. |
| 5,403,389 | A | 4/1995 | Dershem |
| 5,430,112 | A | 7/1995 | Sakata et al. |
| 5,447,988 | A | 9/1995 | Dershem et al. |
| 5,489,641 | A | 2/1996 | Dershem |
| 5,567,761 | A | 10/1996 | Song |
| 5,602,205 | A | 2/1997 | Singh et al. |
| 5,646,241 | A | 7/1997 | Dershem et al. |
| 5,714,086 | A | 2/1998 | Osuna et al. |
| 5,717,034 | A | 2/1998 | Dershem et al. |
| 5,718,941 | A | 2/1998 | Dershem et al. |
| 5,753,748 | A | 5/1998 | Dershem et al. |
| 5,760,165 | A | 6/1998 | Dao et al. |
| 5,861,111 | A | 1/1999 | Dershem et al. |
| 5,969,036 | A | 10/1999 | Dershem |
| 5,973,166 | A | 10/1999 | Mizori et al. |
| 6,034,150 | A | 3/2000 | Hoyle et al. |
| 6,034,194 | A | 3/2000 | Dershem |
| 6,034,195 | A | 3/2000 | Dershem |
| 6,048,953 | A | 4/2000 | Kawashimu et al. |
| 6,121,358 | A | 9/2000 | Dershem et al. |
| 6,187,886 | B1 | 2/2001 | Husson et al. |
| 6,211,320 | B1 | 4/2001 | Dershem et al. |
| 6,300,456 | B1 | 10/2001 | Musa |
| 6,355,750 | B1 | 3/2002 | Herr |
| 6,369,124 | B1 | 4/2002 | Hoyle et al. |
| 6,423,780 | B1 | 7/2002 | Dershem et al. |
| 6,429,281 | B1 | 8/2002 | Dershem et al. |
| 6,521,731 | B2 | 2/2003 | Dershem et al. |
| 6,620,946 | B2 | 9/2003 | Dershem et al. |
| 6,743,852 | B2 | 6/2004 | Dershem et al. |
| 6,750,301 | B1 | 6/2004 | Bonneau et al. |
| 6,790,597 | B2 | 9/2004 | Dershem |
| 6,825,245 | B2 | 11/2004 | Dershem |
| 6,831,132 | B2 | 12/2004 | Liu et al. |
| 6,852,814 | B2 | 2/2005 | Dershem et al. |
| 6,855,745 | B2 | 2/2005 | Hoyle et al. |
| 6,916,856 | B2 | 7/2005 | Dershem |
| 6,946,523 | B2 | 9/2005 | Dershem et al. |
| 6,960,636 | B2 | 11/2005 | Dershem et al. |
| 6,963,001 | B2 | 11/2005 | Dershem et al. |
| 7,102,015 | B2 | 9/2006 | Dershem et al. |
| 7,157,587 | B2 | 1/2007 | Mizori et al. |
| 7,176,044 | B2 | 2/2007 | Forray et al. |
| 7,199,249 | B2 | 4/2007 | Liu et al. |
| 7,208,566 | B2 | 4/2007 | Mizori et al. |
| 7,285,613 | B2 | 10/2007 | Dershem et al. |

(Continued)

FOREIGN PATENT DOCUMENTS

CN 1187507 A 7/1998

(Continued)

OTHER PUBLICATIONS

Lyondell, SAA-100 technical data sheet, Apr. 2002.*
Adamson, "Review of CSP and Flip Chip Underfill Processes and When To Use the Right Dispensing Tools For Efficient Manufacturing", *Paper Presented at GlobalTRONICS Technology Conference,Singapore* 2002, 1-6.
Anand et al., "Copolymerization and thermal behavior of methyl methacrylate with N-(phenyl/p-tolyl) itaconimides", *Journal of Applied Polymer Science 89*: 2003, 1195-1202.
Andersson et al., "Initiator-Free Photopolymerization of an Aliphatic Vinyl Ether-Maleimide Monomer", *J Coatings Tech 69*: 1997, 91-95.
DSM, "Hybrane (TM) DSM's new dendritic polymers", *DSM New Business Development product literature 99-1c* 1999, 1-10.

(Continued)

*Primary Examiner* — Michael Orlando
(74) *Attorney, Agent, or Firm* — The Law Office of Jane K. Babin, Professional Corporation; Jane K. Babin

(57) ABSTRACT

The invention provides derivatives of poly(styrene-co-allylalcohol). These materials are useful as thermosetting monomers that can be incorporated into adhesive compositions. In some embodiments, the adhesive compositions are useful in the microelectronic packaging industry.

9 Claims, No Drawings

U.S. PATENT DOCUMENTS

| | | | |
|---|---|---|---|
| 7,309,724 B2 | 12/2007 | Dershem et al. | |
| 7,326,754 B2 | 2/2008 | Nikolic et al. | |
| 7,517,925 B2 | 4/2009 | Dershem et al. | |
| 7,678,879 B2 | 3/2010 | Dershem | |
| 2002/0062923 A1 | 5/2002 | Forray | |
| 2002/0099168 A1 | 7/2002 | Dershem et al. | |
| 2002/0149659 A1* | 10/2002 | Wu et al. | 347/102 |
| 2002/0188137 A1 | 12/2002 | Dershem et al. | |
| 2002/0193541 A1 | 12/2002 | Dershem et al. | |
| 2002/0198356 A1 | 12/2002 | Dershem et al. | |
| 2003/0008992 A1 | 1/2003 | Dershem et al. | |
| 2003/0055121 A1 | 3/2003 | Dershem et al. | |
| 2003/0060531 A1 | 3/2003 | Dershem et al. | |
| 2003/0083436 A1 | 5/2003 | Deitch | |
| 2003/0087999 A1 | 5/2003 | Dershem et al. | |
| 2003/0109666 A1 | 6/2003 | Dershem et al. | |
| 2003/0125551 A1 | 7/2003 | Dershem et al. | |
| 2003/0199638 A1 | 10/2003 | Liu et al. | |
| 2003/0208016 A1 | 11/2003 | Dershem et al. | |
| 2004/0006166 A1 | 1/2004 | Liu et al. | |
| 2004/0019224 A1 | 1/2004 | Dershem et al. | |
| 2004/0077798 A1 | 4/2004 | Dershem et al. | |
| 2004/0082724 A1 | 4/2004 | Dershem et al. | |
| 2004/0097014 A1* | 5/2004 | Musa | 438/118 |
| 2004/0102566 A1 | 5/2004 | Forray et al. | |
| 2004/0123948 A1 | 7/2004 | Dershem et al. | |
| 2004/0225026 A1 | 11/2004 | Mizori et al. | |
| 2004/0225045 A1 | 11/2004 | Forray | |
| 2004/0225059 A1 | 11/2004 | Mizori et al. | |
| 2005/0027082 A1 | 2/2005 | Narayan-Sarathy et al. | |
| 2005/0107542 A1 | 5/2005 | Liu et al. | |
| 2005/0136620 A1 | 6/2005 | Dershem et al. | |
| 2005/0137277 A1 | 6/2005 | Dershem et al. | |
| 2005/0137340 A1 | 6/2005 | Nikolic et al. | |
| 2005/0267254 A1 | 12/2005 | Mizori et al. | |
| 2005/0272888 A1 | 12/2005 | Dershem et al. | |
| 2006/0009570 A1 | 1/2006 | Zychowski | |
| 2006/0009578 A1 | 1/2006 | Dershem | |
| 2006/0030672 A1 | 2/2006 | Nikolic et al. | |
| 2006/0063014 A1 | 3/2006 | Forray | |
| 2006/0069232 A1 | 3/2006 | Dershem | |
| 2006/0116476 A1 | 6/2006 | Cheng | |
| 2006/0142517 A1 | 6/2006 | Dershem | |
| 2007/0155869 A1 | 7/2007 | Dershem et al. | |
| 2007/0205399 A1 | 9/2007 | Mizori | |
| 2007/0299154 A1 | 12/2007 | Dershem et al. | |
| 2008/0017308 A1 | 1/2008 | Dershem et al. | |
| 2008/0075961 A1 | 3/2008 | Mizori | |
| 2008/0075963 A1 | 3/2008 | Dershem | |
| 2008/0075965 A1 | 3/2008 | Dershem | |
| 2008/0103240 A1 | 5/2008 | Dershem | |
| 2008/0142158 A1 | 6/2008 | Dershem | |
| 2008/0146738 A1 | 6/2008 | Dershem | |
| 2008/0160315 A1 | 7/2008 | Forray et al. | |
| 2008/0191173 A1 | 8/2008 | Dershem et al. | |
| 2008/0210375 A1 | 9/2008 | Dershem et al. | |
| 2008/0251935 A1 | 10/2008 | Dershem | |
| 2008/0257493 A1 | 10/2008 | Dershem | |
| 2008/0262191 A1 | 10/2008 | Mizori | |
| 2009/0061244 A1 | 3/2009 | Dershem | |
| 2009/0215940 A1 | 8/2009 | Dershem | |
| 2009/0288768 A1 | 11/2009 | Dershem | |
| 2010/0041803 A1 | 2/2010 | Dershem | |
| 2010/0041823 A1 | 2/2010 | Dershem | |
| 2010/0041832 A1 | 2/2010 | Dershem | |
| 2010/0041845 A1 | 2/2010 | Dershem et al. | |
| 2010/0056671 A1 | 3/2010 | Dershem | |
| 2010/0063184 A1 | 3/2010 | Dershem | |

FOREIGN PATENT DOCUMENTS

| | | | |
|---|---|---|---|
| EP | 0393713 | | 6/1994 |
| EP | 1156034 A2 | | 11/2001 |
| EP | 1156036 | | 11/2001 |
| EP | 1834969 | | 9/2007 |
| JP | 06157964 A | * | 6/1994 |
| JP | 10287715 | | 10/1998 |
| JP | 2003002919 | | 1/2003 |
| WO | WO-9406862 | | 3/1994 |
| WO | WO 2004099331 | | 11/2004 |
| WO | WO 2005/021666 | * | 3/2005 |
| WO | WO-2005121190 | | 12/2005 |
| WO | WO-2007100329 | | 9/2007 |
| WO | WO-2008077141 | | 6/2008 |
| WO | WO-2008124797 | | 10/2008 |
| WO | WO-2008130894 | | 10/2008 |
| WO | WO-2010019832 | | 2/2010 |

OTHER PUBLICATIONS

Grenier-Loustalot et al., "Monofunctional maleimide or acetylene tennlnated model compounds-I. Molten state homopolymerization reactivity and kinetics", *European Polymer Journal 34*: 1998, 1705-1714.

Klang, "Radiation-curable Hyperbranched Polyester Acrylates", *PCI Magazine* Apr. 2007, 98-101.

Kohli, et al., "Co-Polymerization of Maleimides and Vinyl Ethers: A Structural Study", *Macromolecules 31*: 1998, 5681-5689.

Yamazaki et al., "Effect of N-substrtuents on polymerization reactivity of N-alkylitaconimides in radical polymerization", *European Polymer Journal 33*: 1997, 157-162.

* cited by examiner

DERIVATIVES OF POLY(STYRENE-CO-ALLYL ALCOHOL) AND METHODS FOR USE THEREOF

RELATED APPLICATION DATA

This applications claims the benefit of priority of U.S. Provisional Application Ser. Nos. 60/833,137, filed Jul. 24, 2006, and 60/922,408, filed Apr. 9, 2007, the entire disclosures of which are incorporated herein by reference.

FIELD OF THE INVENTION

The present invention relates to thermosetting adhesive compositions, methods of preparation and uses therefor. In particular, the present invention relates to thermosetting compositions containing derivatives of poly(styrene-co-allyl alcohol).

BACKGROUND OF THE INVENTION

As the electronics industry advances, and production of light weight components increases, the development of new materials gives producers increased options for further improving the performance and ease of manufacture of such components.

Adhesive compositions are used for a variety of purposes in the fabrication and assembly of semiconductor packages and microelectronic devices. The more prominent uses include bonding of electronic elements such as integrated circuit (IC) chips to lead frames or other substrates, and bonding IC chips to other IC chips. Adhesives useful for electronic packaging applications typically exhibit properties such as good mechanical strength, curing properties that do not affect the component or the carrier, and rheological properties compatible with application to microelectronic and semiconductor components.

The demand for smaller and more powerful electronic components presents certain challenges to the microelectronic packaging industry. One way to include more semiconductor die in a component without increasing circuit board area is to arrange the die in a stacked configuration. Indeed, stacked die packages conserve "circuit board real estate" without sacrificing power or performance of the electronic component. In addition, the die used in stacked die applications are becoming ever thinner, requiring new adhesive solutions in order to preserve the integrity of these very thin die.

The microelectronics industry continues to require new adhesives that are able to meet its varying demands. Accordingly, there is a need for the development of materials to address the requirements of this rapidly evolving industry.

SUMMARY OF THE INVENTION

The invention is based on the discovery that the compounds and compositions described herein are useful as adhesives for the electronic packaging industry. The compounds of this invention are based on the commercially available poly(styrene-co-allylacohol) oligomers. It has been found that these oligomers are attractive substrates for a variety of thermoset adhesive compounds. These oligomers are especially attractive for use in microelectronic applications because they are inherently low in ionic impurities and the backbone itself is impervious to hydrolysis. Furthermore, since the pendant functional groups on these oligomers are primary alcohols, the oligomers are very easy to convert to desired compounds without significant side reactions (such as elimination). The alcohol moieties are usually converted in one step to the compounds described in this invention. Optionally, the alcohol moieties in the backbone may be converted to an intermediate functional group (such as a chloride, bromide, iodide, mesylate, tosylate, brosylate, triflate, and the like) which can be further reacted to make the desired functionalized oligomer.

The compounds of this invention are also useful in a variety of other applications. Invention compounds can be used in automotive, marine, and aerospace coatings and adhesives. The properties of certain invention compounds make these compounds suitable for use in dental matrix resins and adhesives. Invention compounds can also be used as components of matrix resins for composites used in sports equipment, automotive bodies, and boat construction. The compounds of this invention also have attractive properties for use in adhesives for diverse industrial applications such as thread-lock materials and building materials.

In one embodiment of the invention, there are provided compounds having the structure:

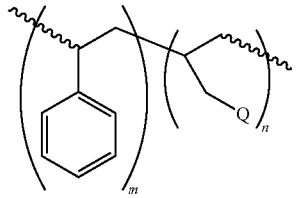

wherein

Q is selected from acrylates, methacrylates, maleimido esters, cinnamates, undecenoates, vinyl ethers, vinyl esters, styrenic compounds, acrylamides, methacrylamides, epoxy, oxetane, acyloxy benzoates, anhydride, itaconates, fumarates, maleates, or allyl functional compounds; and m and n are each independently 3 to about 100.

In other embodiments of the invention, there are provided adhesive compositions and die-attach adhesive compositions including at least one compound of the invention.

In other embodiments, there are provided underfill compositions including at least one compound of the invention.

In still other embodiments of the invention, there are provided compositions for encapsulating electronic components including at least one epoxy compound and at least one compound of the invention.

DETAILED DESCRIPTION OF THE INVENTION

It is to be understood that both the foregoing general description and the following detailed description are exemplary and explanatory only and are not restrictive of the invention claimed. As used herein, the use of the singular includes the plural unless specifically stated otherwise. As used herein, "or" means "and/or" unless stated otherwise. Furthermore, use of the term "including" as well as other forms, such as "includes," and "included," is not limiting. The section headings used herein are for organizational purposes only and are not to be construed as limiting the subject matter described.

Unless specific definitions are provided, the nomenclatures utilized in connection with, and the laboratory procedures and techniques of analytical chemistry, synthetic organic and inorganic chemistry described herein are those known in the art. Standard chemical symbols are used interchangeably with the full names represented by such symbols. Thus, for example, the terms "hydrogen" and "H" are understood to have identical meaning. Standard techniques may be used for chemical syntheses, chemical analyses, and formulation.

Whenever it appears herein, a numerical range, such as "1 to 500" or "$C_1$-$C_{500}$", refers to each integer in the given range; e.g., "$C_1$-$C_{500}$ alkyl" means that an alkyl group may comprise only 1 carbon atom, 2 carbon atoms, 3 carbon atoms, etc., up to and including 500 carbon atoms.

The invention provides derivatives of poly(styrene-co-allylalcohol). In certain embodiments, these materials are useful as thermosetting monomers that can be incorporated into adhesive compositions. In some embodiments, the adhesive compositions are useful in the microelectronic packaging industry. Other embodiments include, marine coatings, sports equipment, industrial film adhesives, composite matrix resins, thread-lock adhesives, dental bonding agents, and the like.

In one embodiment, there are provided compounds having the structure:

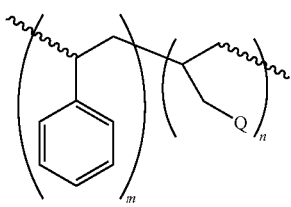

wherein Q is selected from acrylates, methacrylates, maleimido esters, cinnamates, undecenoates, vinyl ethers, vinyl esters, styrenic compounds, acrylamides, methacrylamides, epoxy, oxetane, acyloxy benzoate, anhydride, itaconates, fumarates, maleates, or allyl functional compounds; and m and n are each independently 3 to about 100.

As used herein, the term "acrylate" refers to a compound bearing at least one moiety having the structure:

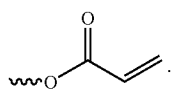

As used herein, the term "methacrylate" refers to a compound bearing at least one moiety having the structure:

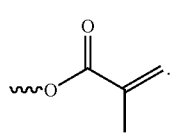

As used herein, the term "maleimido ester" refers to a compound bearing at least one moiety having the structure:

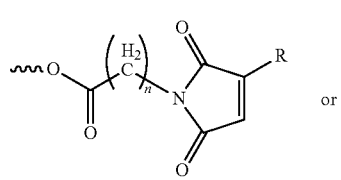

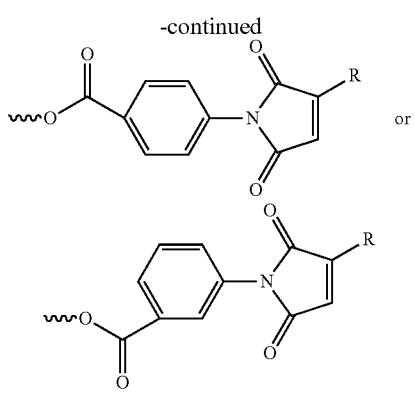

wherein R=H, or Me and n=1-10.

As used herein, the term "epoxy" refers to a compound bearing at least one moiety having the structure:

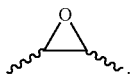

As used herein, the term "vinyl ether" refers to a compound bearing at least one moiety having the structure:

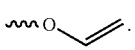

As used herein, the term "acrylamide" refers to a compound bearing at least one moiety having the structure:

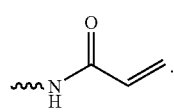

As used herein, the term "methacrylamide" refers to a compound bearing at least one moiety having the structure:

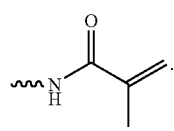

As used herein, the term "itaconate" refers to a compound bearing at least one moiety having the structure:

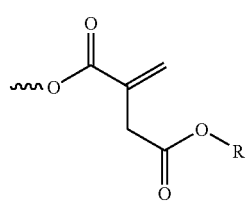

wherein R=lower alkyl.

As used herein, the term "fumarate" refers to a compound bearing at least one moiety having the structure:

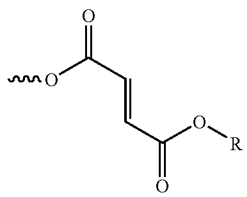

wherein R=lower alkyl.

As used herein, the term "maleate" refers to a compound bearing at least one moiety having the structure:

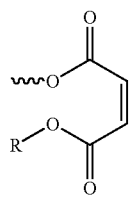

wherein R=lower alkyl.

As used herein, the term "acyloxy benzoate" refers to a compound bearing at least one moiety having the structure:

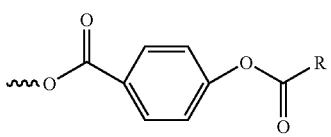

wherein R=H, lower alkyl, or aryl.

As used herein, the term "cinnamate" refers to a compound bearing at least one moiety having the structure:

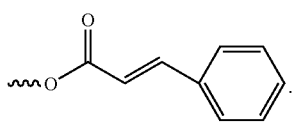

As used herein, the term "undecenoate" refers to a compound bearing at least one moiety having the structure:

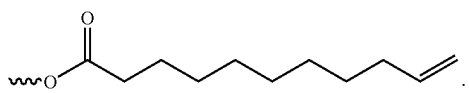

As used herein, the term "cycloaliphatic epoxy ester" refers to a compound bearing at least one moiety having the structure:

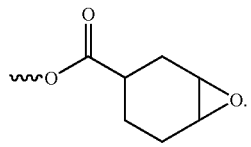

These compounds can be readily prepared by standard organic chemistry techniques, taking advantage of the rich chemical reactivity of the hydroxyl functional group.

The starting material, poly(styrene-co-allylalcohol), has the following structure and is commercially available as random copolymer corresponding to the general structure:

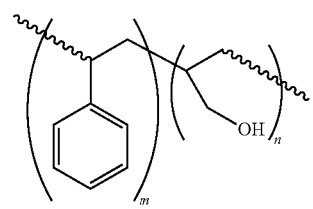

The compounds of the invention are polyfunctional because the starting oligomers are themselves polyfunctional alcohols. The minimum average number of functional groups per molecule is three and the maximum is twelve. Typically, the average number of functional groups per molecule is between five and eight. The high number of functional groups per molecule, results in thermoset monomers with high cross-link density. The high functionality of the invention oligomers is, itself, highly desirable for many applications because highly cross-linked compounds typically have higher glass transition temperatures, lower coefficients of thermal expansion, and higher thermal resistance. In some cases however, it may be desirable to reduce the cross-link functionality for a given cure mechanism. This may be accomplished by leaving some of the pendant alcohol groups un-reacted or by capping a portion of the alcohol functionality with non-reactive residues. The alcohol groups can also participate in other reactions.

It is also possible to make mixed functional oligomers in which the pendant functional groups can be cured by more than one cure mechanism. For example some of the grafted functionality can be vinyl ether while another portion of the fuctional groups is oxetanyl, or glycidyl, aliphatic or cycloaliphatic epoxy. The vinyl ether functional groups could be co-cured with (meth)acrylates, fumarates, maleates, itaconates styrenics, or maleimides in a photoinitiated, free-radical first cure, followed by a second cationic or anionic cure involving the pendant epoxies or oxetane groups.

In some embodiments, a plurality of pendant epoxy or cycloaliphatic epoxy groups distributed along the backbone of the functionalized oligomer are cured via a low temperature photo or thermal cationic mechanism, and then, in a second step, grafted (meth)acrylate, fumarate, itaconate, maleate, or maleimide residues are cured via a thermal free-radical initiator. The invention compositions described herein can be cured in a variety of ways with or without a catalyst In another embodiment of the invention, there are provided adhesive compositions including at least one compound described above and, optionally, at least one curing initiator.

In still another embodiment, there are provided adhesive compositions including
   a) 0.5 weight percent to about 98 weight percent (wt %) of at least one compound described herein, based on total weight of the composition,
   b) 2 weight percent to about 98 weight percent of a compound selected from acrylates, methacrylates, maleimides, vinyl ethers, vinyl esters, styrenic compounds, epoxy, oxetane, acyloxy benzoate, anhydride, itaconates, fumarates, maleates, or allyl functional compounds.
   c) 0 to about 90 wt % of a filler;
   d) 0 wt % to about 5 wt % of at least one curing initiator, based on total weight of the composition;
   e) 0 wt % to about 4 wt %, of at least one coupling agent, based on total weight of the composition.

In some embodiments, there is at least one curing initiator present in the composition from 0.1 wt % to about 5 wt %. In some embodiments, the curing initiator is a free-radical initiator. As used herein, the term "free radical initiator" refers to any chemical species which, upon exposure to sufficient energy (e.g., light, heat, or the like), decomposes into two parts which are uncharged, but which each possess at least one unpaired electron. Preferred free radical initiators contemplated for use in the practice of the present invention are compounds which decompose (i.e., have a half life in the range of about 10 hours) at temperatures in the range of about 70° C. up to 180° C. Exemplary free radical initiators contemplated for use in the practice of the present invention include peroxides (e.g., dicumyl peroxide, dibenzoyl peroxide, 2-butanone peroxide, tert-butyl perbenzoate, di-tert-butyl peroxide, 2,5-bis(tert-butylperoxy)-2,5-dimethylhexane, bis(tert-butyl peroxyisopropyl)benzene, and tert-butyl hydroperoxide), and the like.

The term "free radical initiator" also includes photoinitiators. For example, for invention adhesive compositions that contain a photoinitiator, the curing process can be initiated by UV radiation. In one embodiment, the photoinitiator is present at a concentration of 0.1 wt % to 5 wt % based on the total weight of the organic compounds in the composition (excluding any filler). In a one embodiment, the photoinitiator comprises 0.1 wt % to 3.0 wt %, based on the total weight of the organic compounds in the composition. Photoinitiators include benzoin derivatives, benzilketals, $\alpha,\alpha$-dialkoxyacetophenones, $\alpha$-hydroxyalkylphenones, $\alpha$-aminoalkylphenones, acylphosphine oxides, titanocene compounds, combinations of benzophenones and amines or Michler's ketone, and the like.

Catalysts that may be used to promote cure of epoxy functional groups include tertiary amines such as, triethylamine, tripropylamine, tributylamine; 2-methylimidazole, or any of a wide variety of commercially available imidazoles (such as, for example, the Curezol™ imidazoles available from Air Products), N-methylmorpholine, combinations thereof and the like; quaternary ammonium compounds such as, benzyl trimethyl ammonium chloride, tetrabutylammonium chloride, combinations thereof and the like; phosphines such as triphenylphosphine, tributylphosphine, trilaurylphosphine, trichlorobutylphosphine, trinaphthylphosphine, and the like; and phosphonium compounds such as, ethyltriphenylphosphonium chloride, ethyltriphenylphosphonium bromide, ethyltriphenylphosphonium iodide, ethyltriphenylphosphonium phosphate, ethyltriphenylphosphonium acetate.acetic acid complex, tetrabutylphosphonium chloride, tetrabutylphosphonium bromide, tetrabutylphosphonium iodide, tetrabutylphosphonium phosphate, tetrabutylphosphonium acetate.acetic acid complex, butyltriphenylphosphonium tetrabromobisphenate, butyltriphenylphosphonium bisphenate, butyltriphenylphosphonium bicarbonate, combinations thereof and the like.

The adhesive compositions described herein may further contain additional compounds. Such compounds include, for example, epoxies (such as phenolics, novolacs (both phenolic and cresolic) and the like), imides, monomaleimides, bismaleimides, polymaleimides, cyanate esters, vinyl ethers, vinyl esters, vinyl acetates, cyanoacrylates, styrenes, oxazolines, benzoxazines, oxetanes, and the like, or combinations thereof.

In some embodiments, fillers are contemplated for use in the practice of the present invention. These can be electrically conductive and/or thermally conductive. In addition, the fillers may act to modify the rheology of the resulting composition. Examples of suitable electrically conductive fillers which can be employed in the practice of the present invention include silver, silver-coated copper, nickel, copper, aluminum, palladium, gold, graphite, metal-coated graphite (e.g., nickel-coated graphite, copper-coated graphite, and the like), and the like. Examples of suitable thermally conductive fillers which can be employed in the practice of the present invention include graphite, aluminum nitride, silicon carbide, boron nitride, diamond dust, alumina, and the like. Compounds that act primarily to modify rheology include polysiloxanes silica, fumed silica, alumina, titania, calcium carbonate, and the like.

As used herein, the term "coupling agent" refers to chemical species that are capable of bonding to a mineral surface and which also contain polymerizably reactive functional group(s) so as to enable interaction with the adhesive composition. Coupling agents thus facilitate linkage of the adhesive to the substrate to which it is applied.

Exemplary coupling agents contemplated for use in the practice of the present invention include silicate esters, metal acrylate salts (e.g., aluminum methacrylate), titanates, (e.g., titanium methacryloxyethylacetoacetate triisopropoxide), zirconates, or compounds that contain a copolymerizable group and a chelating ligand (e.g., phosphine, mercaptan, acetoacetate, and the like). In some embodiments, the coupling agents contain both a co-polymerizable function (e.g., vinyl moiety, acrylate moiety, methacrylate moiety, and the like), as well as a silicate ester function. The silicate ester portion of the coupling agent is capable of condensing with metal hydroxides present on the mineral surface of substrate, while the co-polymerizable function is capable of co-polymerizing with the other reactive components of invention die-attach paste. In certain embodiments coupling agents contemplated for use in the practice of the invention are oligomeric silicate coupling agents such as poly(methoxyvinylsiloxane).

In some embodiments, both photoinitiation and thermal initiation may be desirable. For example, curing of a photoinitiator-containing adhesive can be started by UV irradiation, and in a later processing step, curing can be completed by the application of heat to accomplish a free-radical cure. Both UV and thermal initiators may therefore be added to the adhesive composition.

In certain embodiments, the adhesive compositions may contain compounds that lend additional flexibility and toughness to the resultant cured adhesive. Such compounds may be any thermoset or thermoplastic material having a $T_g$ of 50° C. or less, and typically will be a polymeric material characterized by free rotation about the chemical bonds, the presence of ether groups, and the absence of ring structures. Suitable such modifiers include polyacrylates, poly(butadiene), poly-THF (polymerized tetrahydrofuran, also known as poly(1,4- butanediol)), CTBN (carboxy-terminated butadiene-acrylonitrile) rubber, and polypropylene glycol. When present, toughening compounds may be in an amount up to about 15 percent by weight of the invention compound.

Inhibitors for free-radical cure may also be added to the adhesive compositions and die-attach pastes described herein to extend the useful shelf life. Examples of these inhibitors include hindered phenols such as 2,6-di-tert-butyl-4-methylphenol; 2,6-di-tert-butyl-4-methoxyphenol; tert-butyl hydroquinone; tetrakis(methylene(3,5-di-tert-butyl-4-hydroxyhydrocinnamate))benzene; 2,2'-methylenebis(6-tert-butyl-p-cresol); and 1,3,5-trimethyl-2,4,6-tris(3',5'-di-tert-butyl-4-hydroxybenzyl)benzene. Other useful hydrogen-donating antioxidants include derivatives of p-phenylenediamine and diphenylamine. It is also well know in the art that hydrogen-donating antioxidants may be synergistically combined with quinones, and metal deactivators to make a very efficient inhibitor package. Examples of suitable quinones include benzoquinone, 2-tert butyl-1,4-benzoquinone; 2-phenyl-1,4-benzoquinone; naphthoquinone, and 2,5-dichloro-1,4-benzoquinone. Examples of metal deactivators include N,N'-bis(3,5-di-tert-butyl-4-hydroxyhydrocinnamoyl)hydrazine; oxalyl bis(benzylidenehydrazide); and N-phenyl-N'-(4-toluenesulfonyl)-p-phenylenediamine. Nitroxyl radical compounds such as TEMPO (2,2,6,6-tetramethyl-1-piperidnyloxy, free radical) are also effective as inhibitors at low concentrations. The total amount of antioxidant plus synergists typically falls in the range of 100 to 2000 ppm relative to the weight of total base resin. Other additives, such as adhesion promoters, in types and amounts known in the art, may also be added.

In yet another embodiment of the invention, there are provided assemblies of components adhered together employing the above-described adhesive compositions. Thus, for example, assemblies comprising a first article permanently adhered to a second article by the adhesives described herein are provided.

One said adhesive composition includes die attach adhesives used to bond assemblies such as memory devices, ASIC devices, microprocessors, flash memory devices, and the like. Also contemplated are assemblies comprising a microelectronic device permanently adhered to a substrate by the above-described die attach adhesives. Microelectronic devices contemplated for use with invention die attach pastes include copper lead frames, Alloy 42 lead frames, silicon dice, gallium arsenide dice, germanium dice, and the like.

In some embodiments of the invention, there are provided underfill compositions including at least one invention compound, a fluxing agent, and optionally a filler. Two prominent uses for underfill technology are in packages known in the industry as flip-chip, in which a chip is attached to a lead frame, and ball grid array, in which a package of one or more chips is attached to a printed wire board.

The underfill encapsulation may take place after the reflow of the metallic or polymeric interconnect, or it may take place simultaneously with the reflow. If underfill encapsulation takes place after reflow of the interconnect, a measured amount of underfill encapsulant material will be dispensed along one or more peripheral sides of the electronic assembly and capillary action within the component-to-substrate gap draws the material inward. The substrate may be preheated if needed to achieve the desired level of encapsulant viscosity for the optimum capillary action. After the gap is filled, additional underfill encapsulant may be dispensed along the complete assembly periphery to help reduce stress concentrations and prolong the fatigue life of the assembled structure. The underfill encapsulant is subsequently cured to reach its optimized final properties.

If underfill encapsulation is to take place simultaneously with reflow of the solder or polymeric interconnects, the underfill encapsulant, which can include a fluxing agent if solder is the interconnect material, first is applied to either the substrate or the component; then terminals on the component and substrate are aligned and contacted and the assembly heated to reflow the metallic or polymeric interconnect material. During this heating process, curing of the underfill encapsulant occurs simultaneously with reflow of the metallic or polymeric interconnect material.

A wide variety of acids are contemplated for use as the acidic fluxing agent. Typically, the acidic fluxing agent is a carboxylic acid such as, for example, 3-cyclohexene-1-carboxylic acid, 2-hexeneoic acid, 3-hexeneoic acid, 4-hexeneoic acid, acrylic acid, methacrylic acid, crotonic acid, vinyl acetic acid, tiglic acid, 3,3-dimethylacrylic acid, trans-2-pentenoic acid, 4-pentenoic acid, trans-2-methyl-2-pentenoic acid, 2,2-dimethyl-4-pentenoic acid, trans-2-hexenoic acid, trans-3-hexenoic acid, 2-ethyl-2-hexenoic acid, 6-heptenoic acid, 2-octenoic acid, (+/−)-citronellic acid, (R)-(+)-citronellic acid, (S)-(−)-citronellic acid, undecylenic acid, myristolic acid, palmitoleic acid, oleic acid, elaidic acid, cis-11-eicosenoic acid, erucic acid, nervonic acid, cis-3-chloroacrylic acid, trans-3-chloroacrylic acid, 2-bromoacrylic acid, 2-(trifluoromethyl)acrylic acid, 2-(bromomethyl)acrylic acid, 2-cyclopentene-1-acetic acid, (1R-trans)-2-(bromomethyl)-2-methyl-3-methylenecyclopentaneacetic acid, 2-acetamidoacrylic acid, 5-norbornene-2-carboxylic acid, 3-(phenylthio)acrylic acid, trans-styrylacetic acid, trans-cinnamic acid, alpha-methylcinnamic acid, alpha-phenylcinnamic acid, 2-(trifluoromethyl)cinnamic acid, 2-chlorocinnamic acid, 2-methoxycinnamic acid, cis-2-methoxycinnamic acid, 3-methoxycinnamic acid, 4-methylcinnamic acid, 4-methoxycinnamic acid, 2,5-dimethoxycinnamic acid, 3,4-(methylenedioxy)cinnamic acid, 2,4,5-trimethoxycinnamic acid, 3-methylindene-2-carboxylic acid, and trans-3-(4-methylbenzoyl)acrylic acid, oxalic acid, malonic acid, methylmalonic acid, ethylmalonic acid, butylmalonic acid, dimethylmalonic acid, diethylmalonic acid, succinic acid, methylsuccinic acid, 2,2-dimethylsuccinic acid, 2-ethyl-2-methylsuccinic acid, 2,3-dimethylsuccinic acid, meso-2,3-dimethylsuccinic acid, glutaric acid, (+/−)-2-methylglutaric acid, 3-methylglutaric acid, 2,2-dimethylglutaric acid, 2,4-dimethylglutaric acid, 3,3-dimethylglutaric acid, adipic acid, 3-methyladipic acid, (R)-(+)-3-methyladipic acid, 2,2,5,5-tetramethylhexanedioic acid, pimelic acid, suberic acid, azelaic acid, 1,10-decanedicarboxylic acid, sebacic acid, 1,11-undecanedicarboxylic acid, undecanedioic acid, 1,12-dodecanedicarboxylic acid, hexadecanedioic acid, docosanedioic acid, tetracosanedioic acid, tricarballylic acid, beta-methyltricarballylic acid, 1,2,3,4-butanetetracarboxylic acid, itaconic acid, maleic acid, fumaric acid, citraconic acid, mesaconic acid, trans-glutatonic acid, trans-beta-hydromuconic acid, trans-traumatic acid, trans, trans-muconic acid, cis-aconitic acid, trans aconitic acid, (+/−)-chlorosuccinic acid, (+/−)-bromosuccinic acid, meso-2,3-dibromosuccinic acid, hexa fluoroglutaric acid, perfluoroadipic acid hydrate, dibromo-maleic acid, DL-malic acid, D-malic acid, L-malic acid, (R)-(−)-citramalic acid, (S)-(+)-citramalic acid, (+/−)-2-isopropylmalic acid, 3-hydroxy-3-methylglutaric acid, ketomalonic acid monohydrate, DL-tartaric acid, L-tartaric acid, D-tartaric acid, mucic acid, citric acid, citric acid monohydrate, dihydroflumaric acid hydrate, tetrahydrofuran-2,3,4,5-tetracarboxylic acid, mercaptosuccinic acid, meso-2,3-dimercaptosuccinic acid, thiodiglycolic acid, 3,3'-thiodipropionic acid, 3,3'-dithiodipropionic acid, 3-carboxypropyl disulfide, (+/−)-2-(carboxymethylthio) succinic acid, 2,2',2'',2'''-[1,2-ethanediylidenetetrakis(thio)]-tetrakisacetic acid, nitromethanetrispropionic acid, oxalacetic acid, 2-ketoglutaric acid, 2-oxoadipic acid hydrate, 1,3-acetonedicarboxylic acid, 3-oxoadipic acid, 4-ketopimelic acid, 5-oxoazelaic acid, chelidonic acid, 1,1-cyclopropanedicarboxylic acid, 1,1-cyclobutanedicarboxylic acid, (+/−)-trans-1,2-cyclobutanedicarboxylic acid, trans-DL-1,2-cyclopentanedicarboxylic acid, 3,3-tetramethyleneglutaric acid, (1R.3S)-(+)-camphoric acid, (1S.3R)-(−)-camphoric acid, (+/−)-cyclohexylsuccinic acid, 1,1-cyclohexanediacetic acid, (+/−)-trans-1,2-cyclohexanedicarboxylic acid, (+/−)-1,3-cyclohexanedicarboxylic acid, trans-1,2-cyclohexanedicarboxylic acid, 1,4-cyclohexanedicarboxylic acid, 1,3-adamantanedicarboxylic acid, 3-methylenecyclopropane-trans-1,2-dicarboxylic acid, cis-5-norbornene-endo-2,3-dicarboxylic acid, 1,3,5-cyclohexanetricarboxylic acid, 1,3,5-cyclohexanetricarboxylic acid, kemp's triacid, (1 alpha.3alpha.5beta)-1,3,5-trimethyl-1,3,5-cyclohexanetricarboxylic acid, 1,2,3,4-cyclobutane-tetracarboxylic acid, and 1,2,3,4,5,6-cyclo-hexanehexacarboxylic acid monohydrate, phenylmalonic acid, benzylmalonic acid, phenylsuccinic acid, 3-phenylglutaric acid, 1,2-phenylenediacetic acid, homophthalic acid, 1,3-phenylenediacetic acid, 4-carboxyphenoxyacetic acid, 1,4-phenylenediacetic acid, 2,5-dihydroxy-1,4-benzenediacetic acid, 1,4-phenylenediacrylic acid, phthalic acid, isophthalic acid, 1,2,3-benzenetricarboxylic acid hydrate, terephthalic acid, 1,2,4-benzenetricarboxylic acid, 1,2,4,5-benzenetetracarboxylic acid, mellitic acid, 3-(carboxymethylaminomethyl)-4-hydroxybenzoic acid, 4-methylphthalic acid, 2-bromoterephthalic acid, 4-bromoisophthalic acid, 4-hydroxyisophthalic acid, 4-nitrophthalic acid, nitrophthalic acid, 1,4-phenylenedipropionic acid, 5-tert-butylisophthalic acid, 5-hydroxyisophthalic acid, 5-nitroisophthalic acid, 5-(4-carboxy-2-nitrophenoxy)-isophthalic acid, diphenic acid, 4,4'-biphenyldicarboxylic acid, 5,5'dithiobis(2-nitrobenzoic acid), 4-[4-(2-carboxybenozoyl)phenyl]-butyric acid, pamoic acid, 1,4-naphthalenedicarboxylic acid, 2,3-naphthalenedicarboxylic acid, 2,6-naphthalenedicarboxylic acid, 1,4,5,8-naphthalene-tetracarboxylic acid hydrate, 2,7-di-tert-butyl-9,9-dimethyl-4,5-xanthenedicarboxylic acid, and the like.

A particularly useful carboxylic acid for the preparation of the latent fluxing agents of the present invention is DIACID 1550®, a monocyclic $C_{21}$, dicarboxylic acid product derived from tall oil fatty acids, commercially available from Westvaco Corporation.

In additional embodiments of the invention, there are provided compositions for encapsulating electronic components, including at least one epoxy compound and at least one invention compound.

Typically, the at least one epoxy compound is selected from a glycidyl ether of a phenol selected from a phenyl glycidyl ether, a cresyl glycidyl ether, a nonylphenyl glycidyl ether, or a p-tert-butylphenyl glycidyl ether; a diglycidyl ether of a bisphenol selected from bisphenol A, bisphenol F, ethylidinebisphenol, dihydroxydiphenyl ether, N,N'-disalicylalethylenediamine, bis(4-hydroxyphenyl)sulfone, bis(hydroxyphenyl)sulfide, 1,1-bis(hydroxyphenyl)cyclohexane, 9,1,9-bis(4-hydroxyphenyl)fluorene, 1,1,1-tris(hydroxyphenyl) ethane, trihydroxytritylmethane, 4,4'-(1-alpha-methylbenzylidene)bisphenol, 4,4'-(1,3-diethylethylene) diphenol, diethylstilbesterol, 4,4'-dihydroxybenzophenone, resorcinol, catechol, or tetrahydroxydiphenyl sulfide
a glycidyl ether of a cresol formaldehyde,
a glycidyl ether of a fused ring polyaromatic phenol selected from dihydroxy naphthalene, 2,2'-dihydroxy-6,6'-dinaphthyl disulfide, or 1,8,9-trihydroxyanthracene
a glycidyl ether of an aliphatic alcohol selected from a diglycidyl ether of 1,4 butanediol, a diglycidyl ether of neopentyl glycol, a diglycidyl ether of cyclohexane dimethanol, a trimethyol ethane triglycidyl ether, or a trimethyol propane triglycidyl ether,
a glycidyl ether of an aromatic amine, or
a combination of any two or more thereof.

In still further embodiments of the invention, there are provide methods for increasing adhesion of epoxy-based encapsulants to metal substrates. Such methods can be performed, for example, by incorporating into the epoxy-based encapsulant an effective amount of at least one invention compound. Typically, the substrate includes nickel, palladium, or gold, or any combination thereof.

The invention will now be further described with reference to the following non-limiting examples.

EXAMPLES

Example 1

Poly(styrene-co-allylvinyl ether): A 125 mL flask was charged with 4.5 g (10 milliequivalents) SAA-103 (Lyondell), 25 mL toluene, 10.88 g (109 milliequivalents) butylvinyl ether, and 102 mg of Pd(OAc)$_2$ phenanthroline complex. This mixture was stirred overnight at 55° C. An FTIR the following morning demonstrated that almost all of the alcohol function had disappeared. Another 10.15 g portion of n-butylvinyl ether was added and stirring at 55° C. was continued for another nine hours. The crude product was extracted with two 10 mL portions of methanol. The solution of the product that remained in toluene plus excess butylvinyl ether was then passed over 12 g of silica gel. The solvent was removed to yield a glassy, clear, light-yellow solid. There was no evidence via IR of any residual hydroxyl functionality and new absorptions at 1635, 1319, 1200, and 812 wavenumbers were present in the product.

Example 2

Poly(styrene-co-allyl acrylate): A 250 mL flask was charged with 22.4 g (50 milliequivalents) of SAA-103, 7.2 g (100 milliequivalents) acrylic acid, 1.0 g methanesulfonic acid, and 100 mL toluene. The flask was equipped with a stir bar, Dean-Stark trap, and condenser. The mixture was refluxed under an air sparge for 90 minutes and 1.1 mLs water was collected. The catalyst, and excess acrylic acid, were neutralized by stirring the solution with 7.5 g NaHCO$_3$ for two hours. The solution was extracted with two 100 mL portions of methanol, and then passed over 20 g of silica gel. The solvent was removed to yield 21.2 g of a friable, clear yellow solid. An FTIR on this product revealed that the hydroxyl function was completely absent and new absorptions at 1723, 1635, 1406, 1272, 1189, and 809 wavenumbers were present.

Example 3

Poly(styrene-co-allyl cinnamate): A 125 mL flask was charged with 22.4 g (50 milliequivalents) SAA-103, 8.0 g cinnamic acid, 0.3 g methanesulfonic acid, and 50 mL toluene. The flask was equipped with a stir bar, Dean-Stark trap, and a condenser. The mixture was refluxed overnight and 0.9 mL water (equivalent to theory) was collected. The acid was neutralized in the product by stirring it with 5.2 g NaHCO$_3$ plus 2.5 g H$_2$O for three hours. The toluene solution was passed over 21 g silica gel and then evaporated to yield 20.2 g of a friable, light-yellow polymer. The FTIR spectrum of this polymer showed no evidence of residual hydroxyl functionality. There were new absorptions at 1713, 1636, 1309, 1167, and 766 wavenumbers.

Example 4

Poly(styrene-co-allyl acrylate): The polyacrylate of Lyondell's SAA-100 (which has a lower molecular weight and a lower equivalent weight than the SAA-103 used previously) was prepared. A 500 mL flask was charged with 53.4 g (200 milliequivalents) of SAA-100, 18.05 g (250 milliequivalents) of acrylic acid, 150 mL toluene, and 1.0 g methanesulfonic acid. This mix was refluxed under an air sparge for 90 minutes using the same equipment as before. The mix was neutralized with 11.7 g NaHCO$_3$ and 4.9 g H$_2$O and then passed over 16 g of silica gel. The solvent was removed via evaporation and air sparge at 80° C. It was a clear, brown, viscous liquid at this temperature and was a tacky solid at room temperature. The product had prominent absorptions at 1722, 1493, 1406, 1271, 1186, 1055, 984, 809, 758, and 698 wavenumbers.

Example 5

Poly(styrene-co-allyl maleimidocaproate): A 500 mL flask was charged with 13.37 g (50 milliequivalents) SAA-100, 10.55 g (50 millimoles) maleimidocaproic acid, 100 mL toluene and 0.5 g methanesulfonic acid. This mix was refluxed for five hours in the usual apparatus and 1.4 mL H$_2$O was collected. The mixture was neutralized with 5.2 g NaHCO$_3$ and 2.6 g H$_2$O and then dried with 5.2 g anhydrous MgSO$_4$. The solution was then passed over 15 g silica gel. The toluene was removed to yield 17.0 g of a yellow, taffy-like, oligomer. An FTIR run on this product showed the complete absence of any hydroxyl functionality and prominent absorptions at 1729, 1704, 1407, 1167, 826, and 695 wavenumbers.

Example 6

Poly(styrene-co-allyl undecylate): A 500 mL flask was charged with 26.7 g (100 milliequivalents) SAA-100, 19.35 g (105 millimole) undecylenic acid, 100 mL toluene, and 0.5 g methanesulfonic acid. This mixture was refluxed with the usual equipment attached, over a two hour period. A total of 2.1 mL of H$_2$O was collected (theory was 1.8). The solution was neutralized and dried, and then passed over silica gel as before. The solvent was removed to yield 39.7 g (92% of theory) of a viscous, clear, brown, liquid. An FTIR on the product revealed the complete absence of any hydroxyl functionality and prominent absorptions at 2922, 2853, 1733, 1452, 1169, 908, 758, and 698 wavenumbers.

Example 7

Poly(styrene-co-allyl-3-maleimido benzoate): A 500 mL flask was charged with 22.4 g (50 milliequivalents) SAA-103, 10.85 (50 millimole) 3-maleimidobenzoic acid, 100 ml toluene and 0.5 g methanesulfonic acid. This mixture was refluxed as before and worked up to give a friable, light-yellow solid. The FTIR spectrum of this material show the complete absence of any hydroxyl functionality and prominent absorptions at 2930, 1720, 1493, 827, 756, and 700 wavenumers.

Example 8

Poly(styrene-co-allyl methacrylate) in dimer dimethacrylate: A 500 mL flask was charged with 43.04 g (160 milliequivalents) dimer diol, 10.76 g (24 milliequivalents) SAA-103, 17.22 g (200 millimole) methacrylic acid, 100 mL toluene, and 2.0 g methanesulfonic acid. This mix was refluxed with the usual attachments under an air sparge for six hours. A total of 3.3 mLs H$_2$O (equivalent to theory) was collected. The solution was neutralized and dried, and then passed over silica gel. The toluene was removed to give 59.93 g (90.3% of theory) of what at first appeared to be an amber liquid. The product changed to a thin mustard colored slurry upon cooling to room temperature. Some portion of the Methacrylate-functional styrene oligomer was not soluble in the dimer dimethacrylate. There was, however, no evidence of settling of the fine precipitated solid after days at room temperature. An FTIR on the sample revealed the complete absence of hydroxyl functionality and prominent absorptions at 2926, 2853, 1720, 1638, 1454, 1295, 1158, 937, 814, and 699 wavenumbers.

Example 9

Poly(styrene-co-allyl methacrylate) in dimer dimethacrylate: A 500 mL flask was charged with 43.04 g (160 milliequivalents) dimer diol, 10.76 g (49 milliequivalents) SAA-101, 20.0 g (232 millimole) methacrylic acid, 110 mL toluene, and 2.0 g methanesulfonic acid. This mix was refluxed with the usual attachments under an air sparge for five hours. A total of 3.7 mLs H$_2$O (theory=3.6) was collected. The solution was neutralized and dried, and then passed over silica gel. The toluene was removed to yield 61.94 g of a clear, amber liquid. This liquid was found to have a viscosity of 442 centipoise at 25° C. (20 rpm). The mixture remained a homogenous liquid, without any phase separation after standing several days at room temperature.

Examples 10A-C

The mixed poly(styrene-co-allyl methacrylate) dimer dimethacrylate composition of Example 9 was repeated via an identical procedure (which was designated 10A). Two other compositions were also made by this same procedure. The new compositions used higher ratios of the poly(styrene-co-allyl methacrylate) component. The total number of equivalents of hydroxyl functionality was kept constant for all reactions and therefore the same number of equivalents of methacrylic acid was used in all cases. All of the products were stable liquids at room temperature. The design ratios of these mixtures and the resulting viscosities for the products are summarized in Table 1.

Each of the Example 10A-C monomer mixtures was cured in the presence of 2% by weight dicumyl peroxide at 180° C. for one hour. The resulting thermosets were tested via TMA for their glass transition temperature (T$_g$) and coefficient of thermal expansion (CTE). The results of that testing are shown in Table 2.

Adhesive test compositions were also prepared using Examples 10A-C. Each test mixture consisted of 0.04 g A186 silane coupling agent, 0.04 g dicumyl peroxide, 0.50 g F3101 silica filler and 1.42 g of one of the monomer mixtures. The mixtures were thoroughly mixed and then used to attach silicon die to ceramic substrates. The parts were cured for one hour at 175° C. The parts were then tested for shear adhesion at room temperature. The results of that testing is summarized in Table 2.

Examples 11A-C

A new set of mixed monomers was prepared via a method similar to those described in Example 10A-C. The dihydroxy compound 2-butyl-2-ethyl-1,3-propanediol was substituted for the dimer diol used in the previous example. The total number of equivalents of hydroxyl functionality was again kept constant in all cases. All of the resulting monomer compositions were stable liquids at room temperature. The design ratios of these mixtures and the resulting viscosities for the products are summarized in Table 1.

Each of the Example 11A-C monomer mixtures was cured in the presence of 2% by weight dicumyl peroxide at 180° C. for one hour. The resulting thermosets were tested via TMA for their glass transition temperature ($T_g$) and coefficient of thermal expansion (CTE). The results of that testing are shown in Table 2.

Adhesive test compositions were also prepared using Examples 11A C. Each test mixture consisted of 0.04 g A186 silane coupling agent, 0.04 g dicumyl peroxide, 0.50 g F3101 silica filler and 1.42 g of one of the monomer mixtures. The mixtures were thoroughly mixed and then used to attach silicon die to ceramic substrates. The parts were cured for one hour at 175° C. The parts were then tested for shear adhesion at room temperature. The results of that testing is summarized in Table 2.

TABLE 1

Composition and Viscosities of Mixed Monomers

| Experiment | Equivalents SAA-101 | Equivalents Diol | Viscosity (cps, 5 rpm @ 25° C.) |
|---|---|---|---|
| 10A | 0.049 | 0.160[a] | 321 |
| 10B | 0.098 | 0.111[a] | 2,425 |
| 10C | 0.146 | 0.063[a] | 21,586[c] |
| 11A | 0.049 | 0.160[b] | 231 |
| 11B | 0.098 | 0.111[b] | — |
| 11C | 0.146 | 0.063[b] | 4,656 |

Note:
[a]$C_{36}$ dimer diol,
[b]2-butyl-2-ethyl-1,3-propanediol,
[c]40° C.

TABLE 2

Cured Properties and Adhesion of Mixed Monomers

| Experiment | $\alpha_1$ (ppm/° C.) | $\alpha_2$ (ppm/° C.) | $T_g$ (° C.) | Adhesion (kg)[a] |
|---|---|---|---|---|
| 10A | 111.2 | 215.8 | −19.8 | 21.4 |
| 10b | 86.8 | 204.3 | −9.5 | 42.9 |
| 10C | 84.9 | 189.6 | 35.3 | 64.0 |
| 11A | 84.1 | 220.9 | 33.2 | 63.8 |
| 11B | 78.3 | 209.9 | 40.5 | 81.5 |
| 11C | 71.2 | 194.0 | 60.8 | 84.5 |

Note:
[a]Room temperature die shear adhesion for 150 mil square × 14 mil thick, bare silicon die on ceramic substrates tested using a Dage Series 4000. The adhesion value represents the average of six parts for each of the test compositions.

The results summarized in Table 2 demonstrate that a wide range of physical and performance properties can be achieved using the polyfunctional monomers described in this invention. Materials throughout the range of these compositions are useful for the fabrication of adhesive compositions.

While this invention has been described with respect to these specific examples, it should be clear that other modifications and variations would be possible without departing from the spirit of this invention.

What is claimed is:

1. An assembly comprising:
   (a) a substrate;
   (b) an electronic article adhesively affixed to the substrate with an adhesive composition, wherein the electronic article is selected from the group consisting of microelectronic devices, memory devices, ASIC devices, microprocessors and flash memory devices; and
   (c) the adhesive composition comprises an oligomeric compound having the structure:

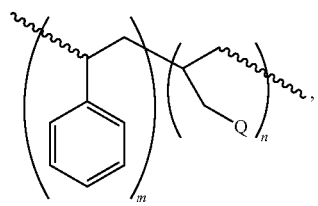

wherein:
Q is selected from the group consisting of maleimido esters, cinnamates, undecenoates, vinyl ethers, vinyl esters, styrenic compounds, epoxies, oxetanes, acyloxy benzoates, anhydrides, itaconates, fumarates, maleates, and allyl functional compounds; and
each of m and n is independently an integer having the value between 3 and about 100,
wherein the backbone of the oligomeric compound is hydrolytically resistant.

2. The assembly of claim 1, wherein the adhesive composition further comprises a compound selected from the group consisting of epoxies, acrylates, methacrylates, maleimides, vinyl ethers, vinyl esters, styrenic compounds, acyloxy benzoate, anhydride, itaconates, fumarates, maleates, and allyl functional compounds.

3. The assembly of claim 1, wherein the adhesive composition comprises:
   a) between about 0.5 weight percent (wt %) and about 98 wt % of at least one oligomeric compound of claim 1, based on total weight of the composition;
   b) between about 2 wt % and about 98 wt % of a compound selected the group consisting of acrylates, methacrylates, maleimides, vinyl ethers, vinyl esters, styrenic compounds, acyloxy benzoate, anhydride, itaconates, fumarates, maleates, and allyl functional compounds;
   c) between about 0 and about 90 wt % of a filler;
   d) between about 0 wt % and about 5 wt % of at least one curing initiator, based on total weight of the composition; and
   e) between about 0 wt % and about 4 wt % of at least one coupling agent, based on total weight of the composition.

4. The assembly of claim 1, wherein the oligomeric compound is prepared from a random copolymer of formula:

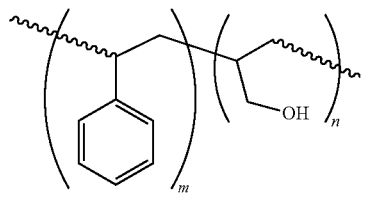

wherein:
each of m and n is independently an integer having the value between 3 and about 100, wherein the alcoholic moieties on the random copolymer are converted to a moiety selected from the group consisting of maleimido esters, cinnamates, undecenoates, vinyl ethers, vinyl esters, styrenic groups, epoxies, oxetanes, acyloxy benzoates, anhydrides, itaconates, fumarates, maleates and allyl functional groups.

5. The assembly of claim 4, wherein alcohol moieties on the random copolymer are converted in a single step.

6. The assembly of claim 4, wherein:
(a) the alcohol moieties on the random copolymer are converted to an intermediate selected the group consisting of from a chloride, a bromide, an iodide a mesylate, a tosylate, a brosylate, and a triflate; and
(b) the intermediate is converted to a moiety selected from the group consisting of a maleimido ester, a cinnamate, an undecenoate, a vinyl ether, a vinyl ester, a styrenic, an epoxy, an oxetane, an acyloxy benzoate, an anhydride, an itaconate, a fumarate, a maleate, and an allyl functional group.

7. The assembly of claim 4, wherein in the formula of the random copolymer the value of n is between 3 and 12.

8. The assembly of claim 4, wherein in the formula of the random copolymer the value of n is between 5 and 8.

9. The assembly of claim 4, wherein at least one of the alcohol moieties in the random copolymer remains unreacted or is capped with a non-reactive residue.

* * * * *